United States Patent
Kang et al.

[11] Patent Number: 5,949,724
[45] Date of Patent: Sep. 7, 1999

[54] BURN-IN STRESS CIRCUIT FOR SEMICONDUCTOR MEMORY DEVICE

[75] Inventors: Sang-seok Kang; Jae-hoon Joo; Kyung-moo Kim; Byung-heon Kwak, all of Suwon, Rep. of Korea

[73] Assignee: Samsung Electronic, Co., Ltd., Suwon, Rep. of Korea

[21] Appl. No.: 08/858,769

[22] Filed: May 19, 1997

[30] Foreign Application Priority Data

May 17, 1996 [KR] Rep. of Korea ............... 96-16739

[51] Int. Cl.⁶ ............................................. G11C 7/00
[52] U.S. Cl. ........................... 365/201; 365/230.06
[58] Field of Search ............... 365/201, 230.06, 365/230.08, 230.03; 371/21.1, 21.2, 21.4

[56] References Cited

U.S. PATENT DOCUMENTS

| | | | |
|---|---|---|---|
| 4,868,823 | 9/1989 | White | 371/21.3 |
| 5,258,954 | 11/1993 | Furuyama | 365/201 |
| 5,265,100 | 11/1993 | McClure | 371/21.2 |
| 5,276,647 | 1/1994 | Matsui | 365/201 |
| 5,301,155 | 4/1994 | Wada | 365/201 |
| 5,615,164 | 3/1997 | Kirihata | 365/230.06 |

*Primary Examiner*—Son Mai
*Attorney, Agent, or Firm*—Marger & Johnson & McCollom, P.C.

[57] ABSTRACT

A burn-in stress circuit for a semiconductor memory device. A burn-in enable signal generator generates a burn-in enable signal in response to a plurality of control signals. A wordline predecoder generates a wordline driving voltage for driving a wordline in response to the burn-in enable signal and another a plurality of control signals. A wordline decoder applies the wordline driving voltage to the wordline in response to the burn-in enable signal and another plurality of control signals. To reduce the stress testing time by stressing multiple rows of a memory array simultaneously, all of the wordlines (rows) are stressed and or tested at the same time. To select all of the wordlines, the wordlines are selected sequentially, but each selected wordline is held in a selected state by a latching mechanism while all of the other wordlines are being selected as well. When all of the wordlines (or a desired subset) have been selected, the burn-in stress test begins.

14 Claims, 8 Drawing Sheets

Fig. 1 *(PRIOR ART)*

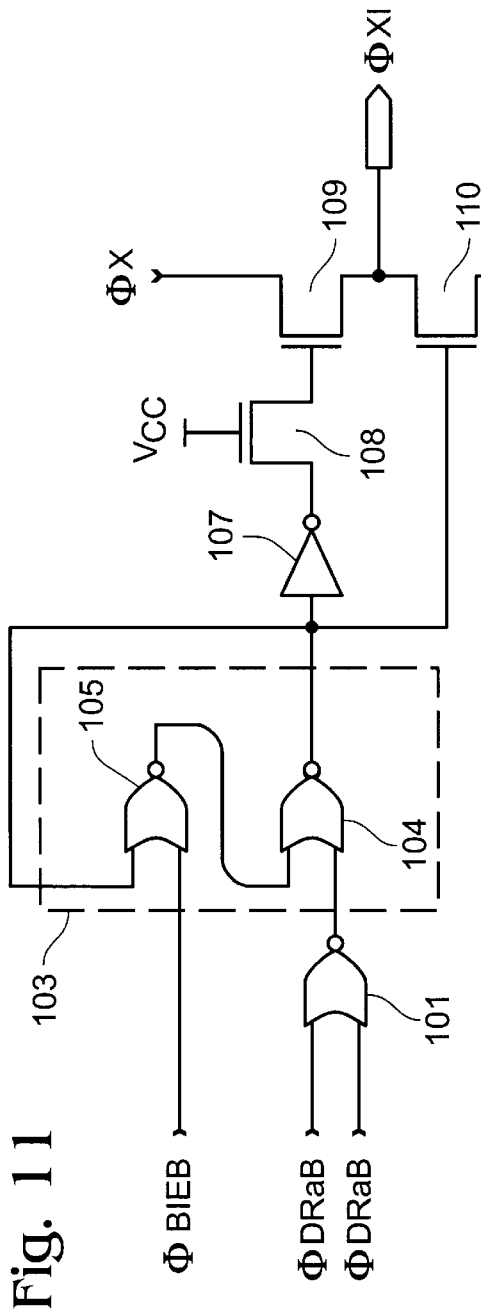
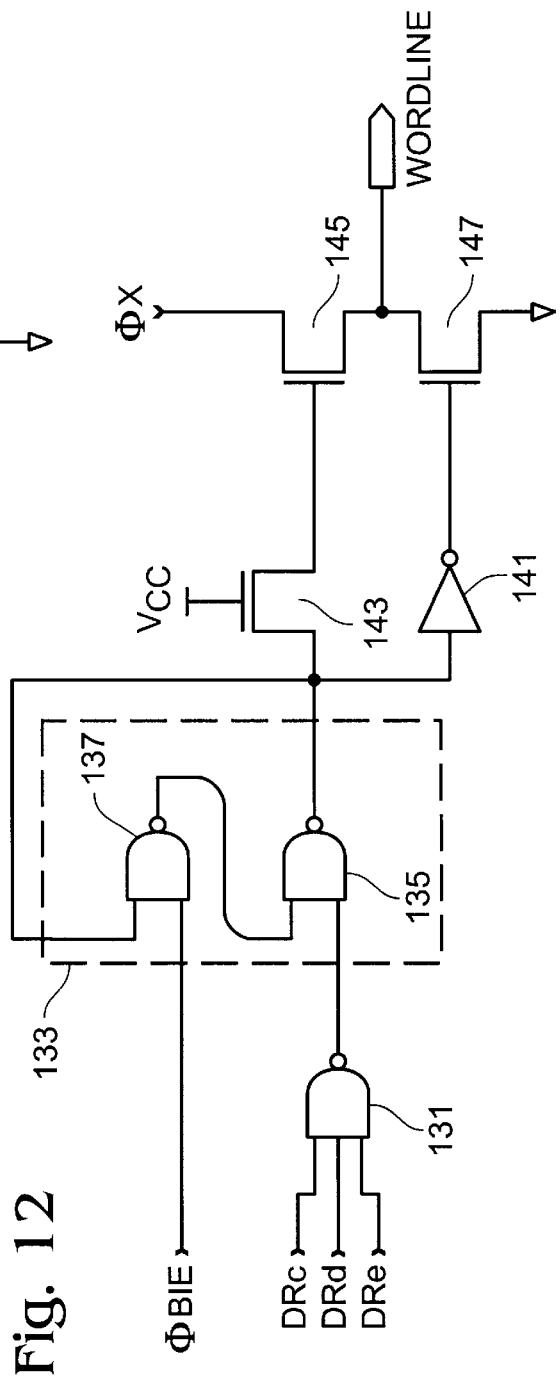

BURN-IN STRESS CIRCUIT FOR SEMICONDUCTOR MEMORY DEVICE

BACKGROUND OF THE INVENTION

1. FIELD OF THE INVENTION

The present invention relates to a semiconductor memory device, and more particularly, to improved methods and apparatus for burn-in stress testing of semiconductor memory devices.

2. DESCRIPTION OF THE RELATED ART

As semiconductor memory devices become more highly integrated, defects in memory cells are increased due to processing problems and the like. Furthermore, as a chip becomes increasingly highly integrated, the size of each individual transistor of the chip is decreased. As a result, when the external power voltage is applied to the size-reduced transistor, the stress thereof is increased, thereby forming a strong electric field, which degrades the transistor. Thus, in order to attain reliability of a semiconductor chip by initially detecting defects in memory cells, a burn-in stress is performed upon completion of the chip. This is done by applying a high-voltage which exceeds the maximum external power voltage stipulated in the chip specification to the gate of a memory cell transistor, at a high-temperature and for a relatively long time, e.g. several minutes. Thus, the stress applied to various elements of the chip is increased, thereby facilitating initial detection of defects. Conversely, a device that survives this burn-in stress testing is more likely to be reliable in normal use.

The stressing method is generally performed in the following manner. In known DRAM devices, only a single wordline is asserted (H) during a row address strobe (RAS/) cycle, although the same wordline may be simultaneously asserted in several arrays of memory cells within the same device. FIG. 1 shows the architecture of a conventional 4-Mbit DRAM, in which four memory cell sub-arrays are disposed in a matrix, each sub-array having 1024 rows. The sub-arrays are simultaneously enabled. In other words, when a row address strobe signal (RAS/) is asserted, and the first row is addressed, each first row of the respective memory cell sub-arrays 1M, 1M', 1M" and 1M'" becomes active. When the (RAS/) is in the precharge state, each first row of the respective sub-arrays 1M, 1M', 1M" and 1M'" is reset.

Then, when the next (RAS/) is asserted, each second row of the respective sub-arrays 1M, 1M', 1M" and 1M'" becomes active. In this manner, each row of the arrays is sequentially accessed to carry out the burn-in test. The process is thorough but time consuming. For example, if a burn-in time is set to about 72 hours, which may vary according to manufacturers and chip characteristics, a high voltage stress is applied to each row (and thus to each access transistor) for about 4.2 minutes (72 hours÷1024). The above-described burn-in test procedure causes a substantial increase in the burn-in time when the number of memory cells disposed in the chip increases. In the case of a 16-Mbit DRAM, in order to allow a stress time of about 4.2 minutes to an access transistor, a burn-in time of 288 hours (72×4) is required, and in the case of a 64-Mbit DRAM, a burn-in time of 576 hours (72×8) is required. This time frame is not practical.

In the above-described prior art, the burn-in test in respective access transistors connected to each wordline is performed while memory cell arrays of the semiconductor memory device are sequentially activated from the first wordline. In other words, the burn-in stress time is excessive because it proceeds row-by-row, one row at a time. Moreover, since the testing is done one row at a time, the stress time increases linearly with increases in the depth of the memory, as illustrated above.

SUMMARY OF THE INVENTION

In view of the foregoing background, it is an object of the present invention to reduce burn-in stress time in a memory. Another object is to provide a stress-testing mode of operation for stressing multiple rows of memory cells simultaneously.

According to one aspect of the invention, there is provided a burn-in stress circuit. A burn-in enable signal generator generates a burn-in enable signal in response to a plurality of control signals. A wordline predecoder generates a wordline driving voltage for driving a wordline in response to the burn-in enable signal and another a plurality of control signals. A wordline decoder applies the wordline driving voltage to the wordline in response to the burn-in enable signal and another plurality of control signals. A bitline activating signal generator generates a bitline activating signal in response to the burn-in enable signal and another plurality of control signals. A bitline detector operates in response to the bitline activating signal. Three different embodiments of the burn-in enable signal generator are described.

The present invention provides methods and circuits for reducing the stress testing time by stressing multiple rows of a memory array simultaneously. In a preferred embodiment, all of the wordlines (rows) are stressed and/or tested at the same time. The burn-in stress test starts after all of the wordlines are selected. To select all of the wordlines, the wordlines are selected sequentially, but each selected wordline is held in a selected state by a novel latching mechanism (FIG. 12 is illustrative) while all of the other wordlines are being selected as well. When all of the wordlines (or a desired subset) have been selected, the burn-in stress test begins. The test time thus is reduced over prior art by factor proportional to the number of wordlines so tested. When the burn-in test is completed, the burn-in enable signal latch is reset to return to normal operation.

BRIEF DESCRIPTION OF THE DRAWINGS

The above objects and advantages of the present invention will become more apparent by describing in detail a preferred embodiment thereof with reference to the attached drawings in which:

FIG. 11 is a circuit diagram of a wordline predecoder according to a preferred embodiment of the present invention;

FIG. 12 is a circuit diagram of a wordline decoder according to a preferred embodiment of the present invention;

DETAILED DESCRIPTION OF THE PREFERRED EMBODIMENTS

Several illustrative embodiments of the present invention will be described in detail below with reference to the accompanying drawings.

Figure 1:
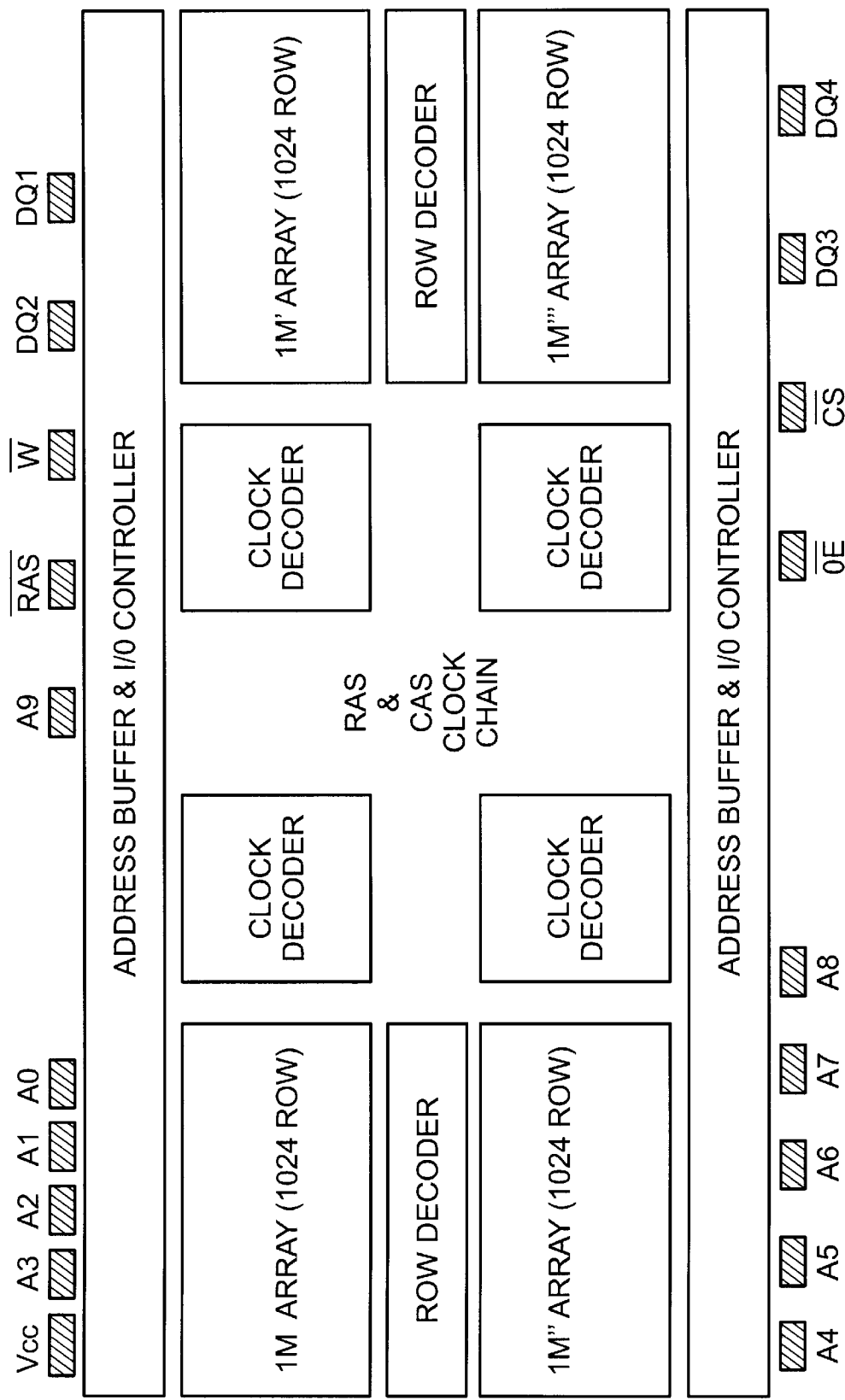
FIG. 1 shows the architecture of a conventional 4-Mbit DRAM chip.
Figure 2:
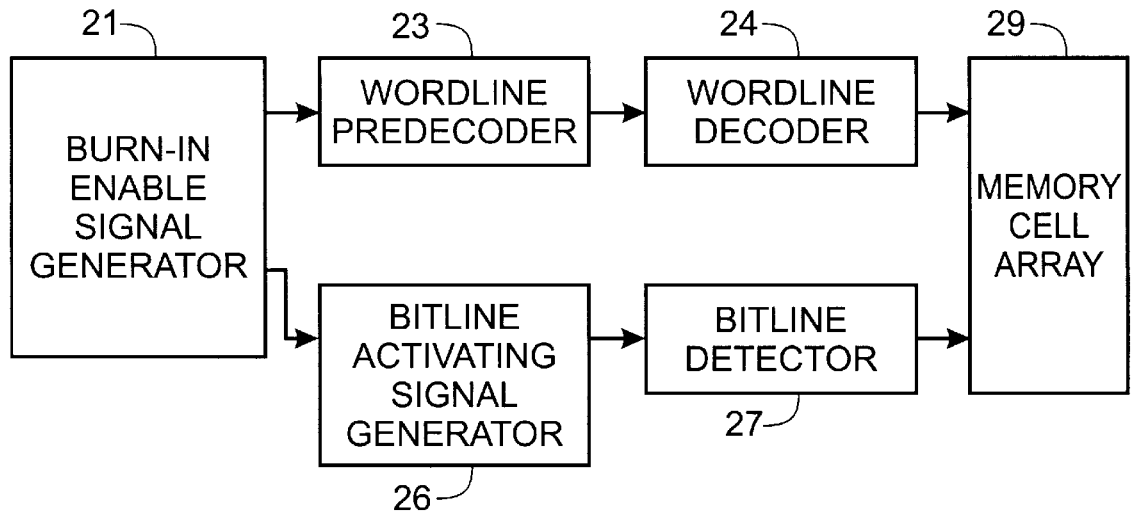
FIG. 2 is a block diagram of a burn-in stress circuit according to the present invention.

FIG. 2 is a block diagram of a burn-in stress circuit according to the present invention, which includes a burn-in enable signal generator 21, a wordline predecoder 23 connected to the burn-in enable signal generator 21, a wordline decoder 24 for driving a wordline using an output signal of the wordline predecoder 23, a bitline activating signal generator 26 connected to the burn-in enable signal generator 21, a bitline sensor 27 connected to the bitline activating signal generator 26, and a memory cell array 29 connected to the bitline sensor 27 and wordline decoder 24.

Figure 3:
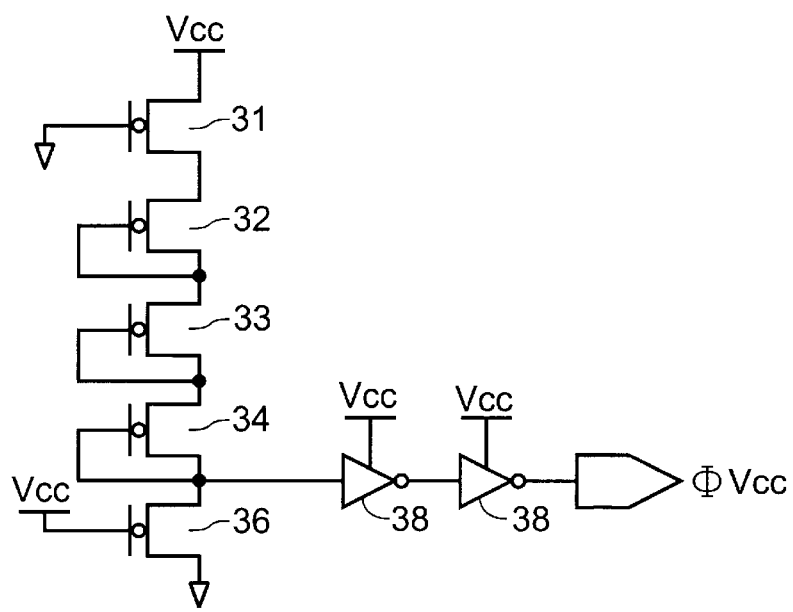
FIG. 3 is a circuit diagram showing the generation of a first control signal ΦVcc in a burn-in enable signal generator shown in FIG. 2.

FIG. 3 is a circuit diagram showing the generation of a first control signal ΦVcc in a burn-in enable signal generator 21 shown in FIG. 2, which includes four PMOS transistors 31, 32, 33 and 34 serially connected to a power supply voltage Vcc, a first NMOS transistor 36, and first and second inverters 38 and 39 which receive the power supply source Vcc serially connected to the drain of the first NMOS transistor 36. The first control signal ΦVcc is output from the second inverter 39.

Figure 4:
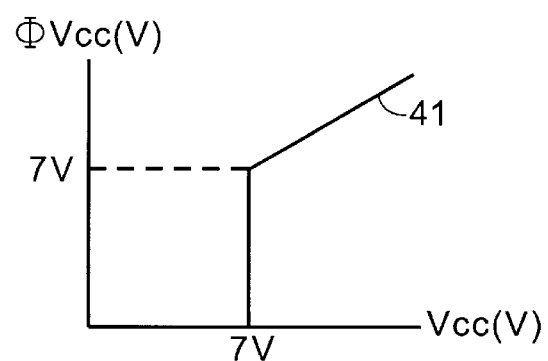
FIG. 4 is a waveform diagram of the output signal ΦVcc of FIG. 3.

FIG. 4 is a waveform diagram of the output signal of FIG. 3 and the operation of the circuit described in FIG. 3 will be explained with reference to FIG. 4. Since the PMOS transistors 32, 33 and 34 are deactivated and the NMOS transistor 36 is activated before Vcc reaches 7 volts, ΦVcc is zero volts as long as Vcc is below 7 volts. When Vcc is 7 volts, the PMOS transistors 31, 32, 33 and 34 are activated so that ΦVcc becomes 7 volts. When Vcc exceeds 7 volts, ΦVcc is pulled up along with Vcc, as indicated at 41 in the waveform of FIG. 4.

Figure 5:
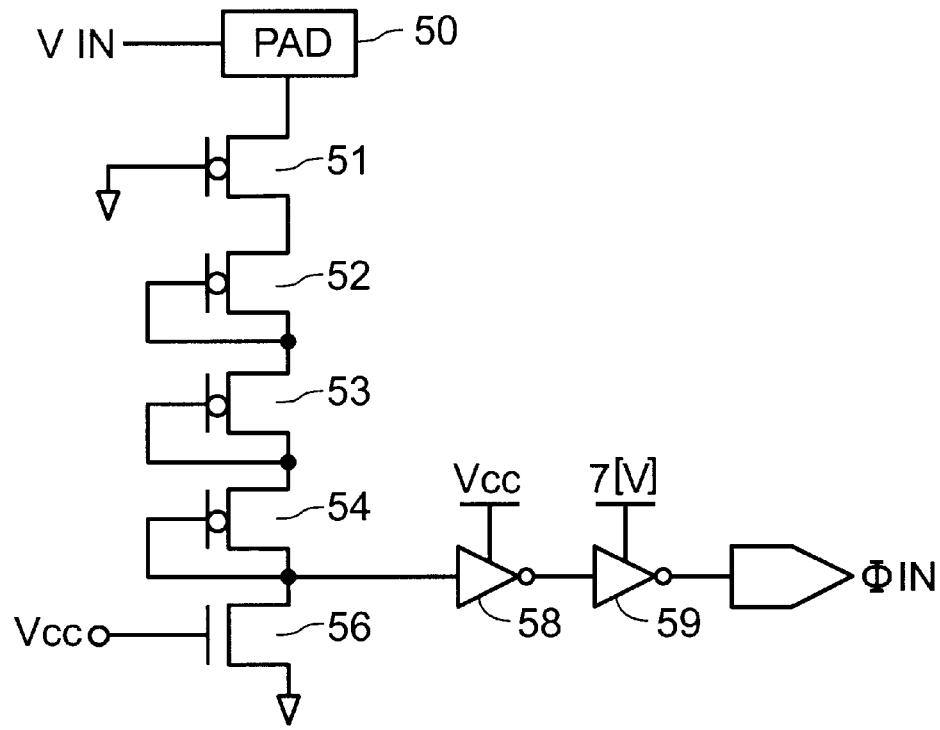
FIG. 5 is a circuit diagram showing the generation of a second control signal ØIn in the burn-in enable signal generator shown in FIG. 2.

FIG. 5 is a circuit diagram showing the generation of a second control signal Φin in the burn-in enable signal generator 21 of FIG. 2, which includes a pad 50, four PMOS transistors 51, 52, 53 and 54 and a second NMOS transistor 56 serially connected to the pad 50, and third and fourth inverters 58 and 59 connected to the drain of the second NMOS transistor 56. Here, an external voltage Vin is input through the pad 50, and a second control signal Φin is output from the fourth inverter 59.

Figure 6:
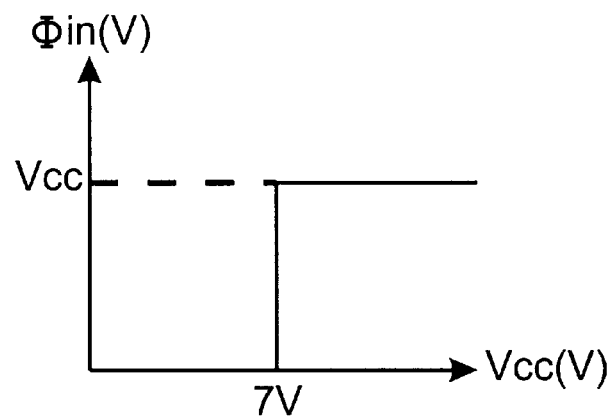
FIG. 6 is a waveform diagram of the output signal ØIn of FIG. 5.

FIG. 6 is a waveform diagram of the output signal Φin of FIG. 5. The operation of the circuit described in FIG. 5 is similar to that which was described in FIG. 3. However, as illustrated in FIG. 6, Φin is zero volts as long as Vin is below 7 volts; and even when Vin exceeds 7 volts, Φin remains clamped at 7 volts. This is because the supply voltage Vcc applied to the fourth inverter 59 is fixed at 7 volts, which is therefore the maximum value of Φin.

Figure 7:
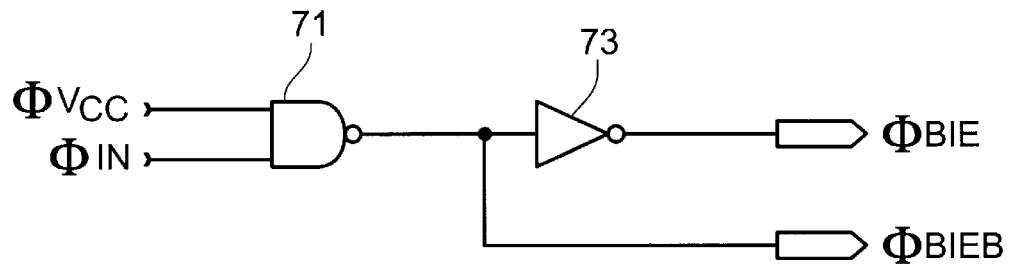
FIG. 7 is a circuit diagram of the burn-in enable signal generator shown in FIG. 2 according to a first embodiment of the present invention.

FIG. 7 is a circuit diagram of the burn-in enable signal generator (21 in FIG. 2) according to a first embodiment of the present invention, which includes a first NAND gate 71 which receives a ΦVcc signal and the Φin signal, and inverter 73, the input port of which is connected to the output of the first NAND gate 71. A burn-in enable signal ΦBIE is output from inverter 73, and a burn-in enable bar signal ΦBIEB which is an inverted signal of the burn-in enable signal ΦBIE is output from the output port of the first NAND gate 71. In FIG. 7, only when both ΦVcc and Φin are "high", ΦBIE is output in a logic "high" state (H). When either ΦVcc or Φin goes "low" (L), the ΦBIE is output in a logic "low" state (L).

Figure 8:
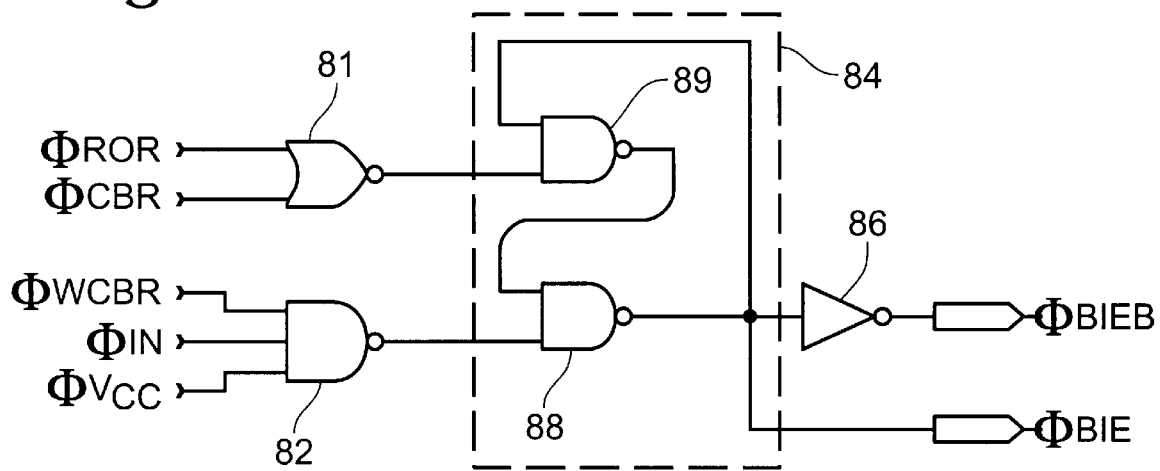
FIG. 8 is a circuit diagram of the burn-in enable signal generator shown in FIG. 2 according to a second embodiment of the present invention.

FIG. 8 is a circuit diagram of the burn-in enable signal generator according to a second embodiment of the present invention. Here, a first NOR gate 81 having ΦROR (RAS/ only refresh) and ΦCBR (CAS/ before RAS/ refresh) as its inputs, a second NAND gate 82 having ΦWCBR (WE/ and CAS/ before RAS/ cycle), the Φin signal and ΦVcc as its inputs, a first latching circuit 84 having the outputs of the NOR gate 81 and NAND gate 82 as its inputs, and inverter 86 whose input port is connected to the output port of a first latching circuit 84. The burn-in enable signal ΦBIE) is output from the output port of the first latching circuit 84 and the burn-in enable bar (complement) signal thereof ΦBIEB) is output from the output port of inverter 86. The first latching circuit 84 has a NAND gate 88 for receiving the output of NAND gate 82 as its input, and a NAND gate 89 for receiving the outputs of NAND gate 88 and NOR gate 81 as its inputs and applying its output to NAND gate 88.

Figure 9:
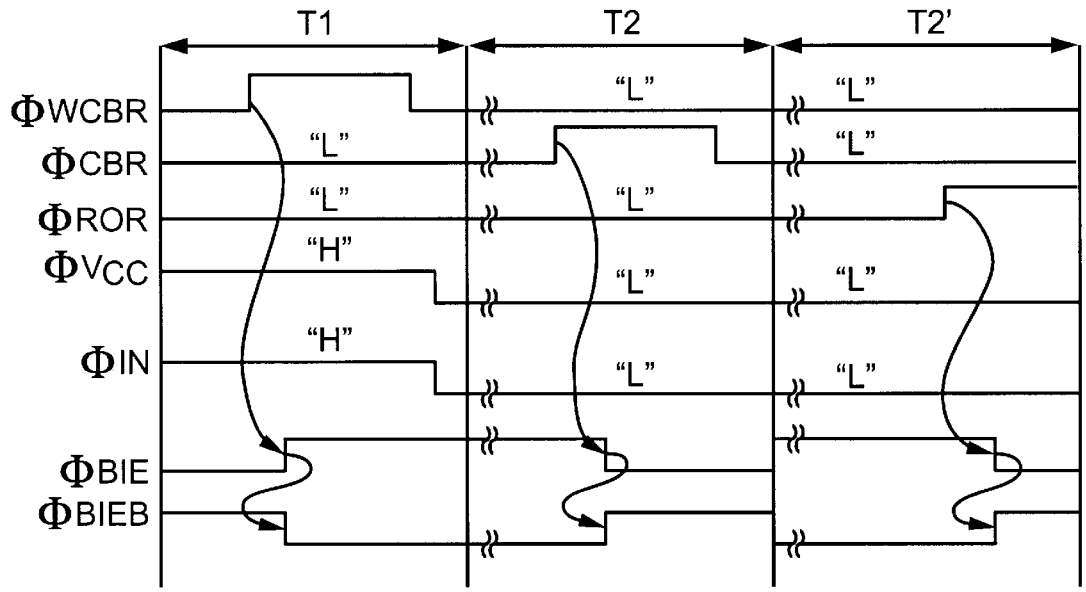
FIG. 9 is a timing diagram illustrating operation of the circuit of FIG. 8.

FIG. 9 is a timing diagram of various signals generated by the circuit shown in FIG. 8. When the RAS/ signal is enabled together with CAS/ and WE/, ΦWCBR only is enabled. In the state where CAS/ is enabled and WE/ is disabled, when the RAS/ signal is enabled, ΦCBR only is enabled. In the state where both CAS/ and WE/ are disabled, if RAS/ is enabled, ΦROR only is enabled.

The operation of the circuit shown in FIG. 8 will now be described with reference to FIG. 9. In order to enter into a burn-in mode, Φin, ΦVcc and ΦWCBR must be logic "high" (H). When this is the case, the output of the second NAND gate 82 goes "low", and the output of the third NAND gate 88 goes "high", irrespective of the output of the fourth NAND gate 89, so that ΦBIE is "high". Next, since ΦROR and ΦCBR are logic "low", the output of the first NOR gate 81 goes "high". Since both ΦBIE and the output of the first NOR gate 81 are logic "high", the output of the fourth NAND gate 89 receiving the output of the first NOR gate 81 as its input goes "low" and is input to the third NAND gate 88. Thus the burn-in test enable signal is latched in the active or asserted state. The output of the first latching circuit 84, i.e., ΦBIE, maintains a logic 'high' state, irrespective of the logic states of Φin and ΦVcc, which are not necessarily maintained at a "high" voltage of 7 volts. Similarly, even if ΦWCBR is disabled, ΦBIE is not affected (see T1 of FIG. 9). In this way, the device is latched by the foregoing control signals into a burn-in test mode of operation that persists until reset, even if the supply voltages fall below the 7-volt trigger voltage. If ΦWCBR is replaced with another signal, ΦWCBR can be controlled independently from RAS/.

In order to reset the burn-in mode, ΦCBR must be asserted. Here, ΦCBR is enabled as demonstrated in the period T2 of FIG. 9. Then, the output of NOR gate 81 goes "low" and the output of NAND gate 89 goes "high". Therefore, ΦBIE goes "low" and the latch is reset, thereby resetting (or leaving) the burn-in mode. Another way for resetting the burn-in mode is to disable the RAS/. In this case, ΦROR is enabled (see the period T2' of FIG. 9), the output of the NOR gate 81 goes "low", and the output of the NAND gate 89 goes "high", so that ΦBIE goes "low", thereby resetting the burn-in mode.

Figure 10:
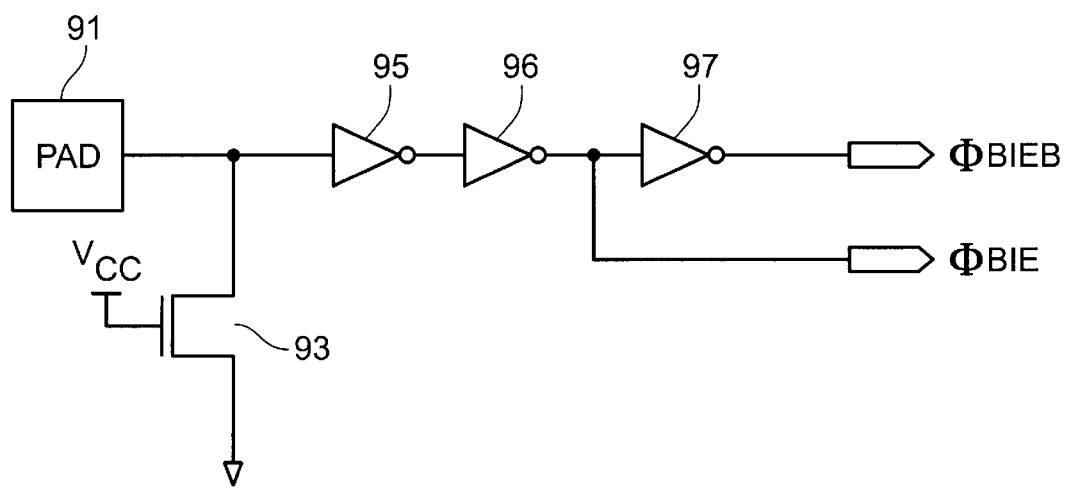
FIG. 10 is a circuit diagram of the burn-in enable signal generator according to a third embodiment of the present invention.

FIG. 10 is a circuit diagram of the burn-in enable signal generator according to a third embodiment of the present invention. This circuit includes an input pad 91 for external connection, a third NMOS transistor 93 whose drain is connected to the pad 91, and seventh, eighth and ninth inverters 95, 96 and 97 serially connected to the pad 91. The source of the third NMOS transistor 93 is grounded. Also, ΦBIE is connected to the output port of inverter 96, and ΦBIEB is connected to the output port of an inverter 97. The burn-in enable signal generator shown in FIG. 10 is effective in performing burn-in stress on a wafer.

In FIG. 10, in order to enable the burn-in mode, a logic "high" signal is externally applied to the pad 91. Then, ΦBIE goes "high" to then enter into the burn-in mode (and ΦBIEB goes low). In order to reset the burn-in mode, a logic "low" signal or no signal is applied to the pad 91. Then, ΦBIE goes low to then reset the burn-in mode. Thus, in this embodiment, the burn-in mode persists as long as a logic high signal is applied at the pad 91. This control signal can be at ordinary logic voltage levels.

FIG. 11 is a circuit diagram of a wordline predecoder shown in FIG. 2 according to a preferred embodiment of the present invention. This circuit includes a NOR gate 101 having DRaB and DRbB which are row address decoding signals as its inputs, a second latching circuit 103 having the output of NOR gate 101 and ΦBIEB as its inputs, an inverter 107 whose input port is connected to the output port of the second latching circuit 103, an NMOS transistor 108 having its drain connected to inverter 107 and its gate connected to a power supply source (Vcc), another NMOS transistor 109 having its gate connected to the source of NMOS transistor 108 and its drain connected to ΦX, and another NMOS transistor 110 having its drain connected to the source of NMOS transistor 109, its gate connected to the output port of the second latching circuit 103, and its source grounded. Here, ΦXi is connected to the drain of NMOS transistor 109.

The second latching circuit 103 includes a NOR gate 104 for receiving the output of NOR gate 101 as its input, and a NOR gate 105 for receiving the output of NOR gate 104 and ΦBIEB as its inputs and applying its output to the NOR gate 104. In other words, the gates are cross-coupled so as to form a latch circuit.

Now, the operation of the circuit shown in FIG. 11 will be described. Initially, DRaB, DRbB and ΦBIEB are logic "high". Therefore, the outputs of NOR gates 101 and 105 are logic "low" and the output of NOR gate 104 is logic "high". This state of affairs drives NMOS transistor 109 so that it is deactivated or off, and NMOS transistor 110 is activated, so that ΦXi goes "low". In such a state, as the burn-in mode is enabled, ΦBIEB, DRAB and DRbB become logic "low". Then, the output of NOR gate 101 goes "high" and the output of NOR gate 104 goes "low"; thus NMOS transistor 109 is activated and NMOS transistor 110 is deactivated, so that ΦXi is changed from a logic "low" to a logic "high". Meanwhile, the output of NOR gate 104 is fed back to NOR gate 105 and the output of NOR gate 105 goes "high" so that the output of the second latching circuit 103 is kept "low", irrespective of DRaB and DRbB. Thus, ΦXi is latched "high".

In order to reset ΦXi, ΦBIEB, DRaB and DRbB must be changed from a logic "low" to a logic "high". When this is the case the outputs of both NOR gates 101 and 105 go "low", and the output of NOR gate 104 goes "high", thereby changing ΦXi to a logic "low".

FIG. 12 is a circuit diagram of the wordline decoder shown in FIG. 2 according to a preferred embodiment of the present invention. This circuit includes a NAND gate 131 having DRc, DRd and DRe which are row address decoding signals as its inputs. A third latching circuit 133 has ΦBIE and the output of NAND gate 131 as its inputs. An NMOS transistor 143 has its drain connected to the output port of the third latching circuit 133 and its gate connected to a power supply source (Vcc). Yet another NMOS transistor 145 has its gate connected to the source of NMOS transistor 143 and its drain connected to receive ΦXi. An inverter 141 has its input port connected to the output port of the third latching circuit 133, and an NMOS transistor 147 has its gate connected to the output port of inverter 141, its source grounded, and its drain connected to the source of NMOS transistor 145. Also, a corresponding wordline is connected to the source of NMOS transistor 145. Similar circuitry is provided for each wordline in the memory. The third latching circuit 133 includes a NAND gate 135 for receiving the output of NAND gate 131 as its input, and a NAND gate 137 for receiving the output of the sixth NAND gate 135 and ΦBIE as its inputs and applying its output back to NAND gate 135. In other words, the gates 135, 137 are cross-coupled so as to form a latch circuit.

The operation of the circuit shown in FIG. 12 will now be described. Initially, DRc, DRd, DRe and ΦBIE are logic "low". Therefore, the outputs of NAND gates 131 and 137 are logic "high" which causes the output of NAND gate 135 to go "low". Thus, NMOS transistor 145 is deactivated and NMOS transistor 147 is activated so that ΦXi is not transmitted to the wordline; therefore, the wordline goes "low". In this state, as the burn-in mode is enabled, ΦBIE, DRc, DRd and DRe become logic "high". Then, the output of NAND gate 131 goes "low", and the output of NAND gate 135 goes "high", so that NMOS transistor 145 is activated and NMOS transistor 147 is deactivated. Thus the wordline changes from a logic "low" to a logic "high" or asserted state. At the same time, the output of NAND gate 135 is fed back to NAND gate 137 and the output of NAND gate 137 goes "high", so that the output of the third latching circuit 133 is kept "high", irrespective of the logic states of signals DRc, DRd and DRe. Thus, the wordline is also latched "high".

As described above, when ΦBIE, DRc, DRd and DRe are in a logic "high" at the same time in the burn-in mode, the wordline continuously maintains active state. Additional wordlines can be activated in like fashion, by stepping through the range of row addresses, without leaving the burn-in mode. When the burn-in test is performed after activating other wordlines using the above method, the burn-in time is reduced. Also, the burn-in time is not increased even though the memory capacity in a semiconductor memory device increases.

In order to reset the wordline, ΦBIE, DRc, DRd and DRe must be changed from a logic "high" to a logic "low". Then, the outputs of both NAND gates 131 and 137 go "high". Therefore, the output of NAND gate 135 goes "low", thus NMOS transistor 145 is deactivated and NMOS transistor 147 is activated, thereby changing the wordline to a logic "low" or inactive state.

Figure 13:
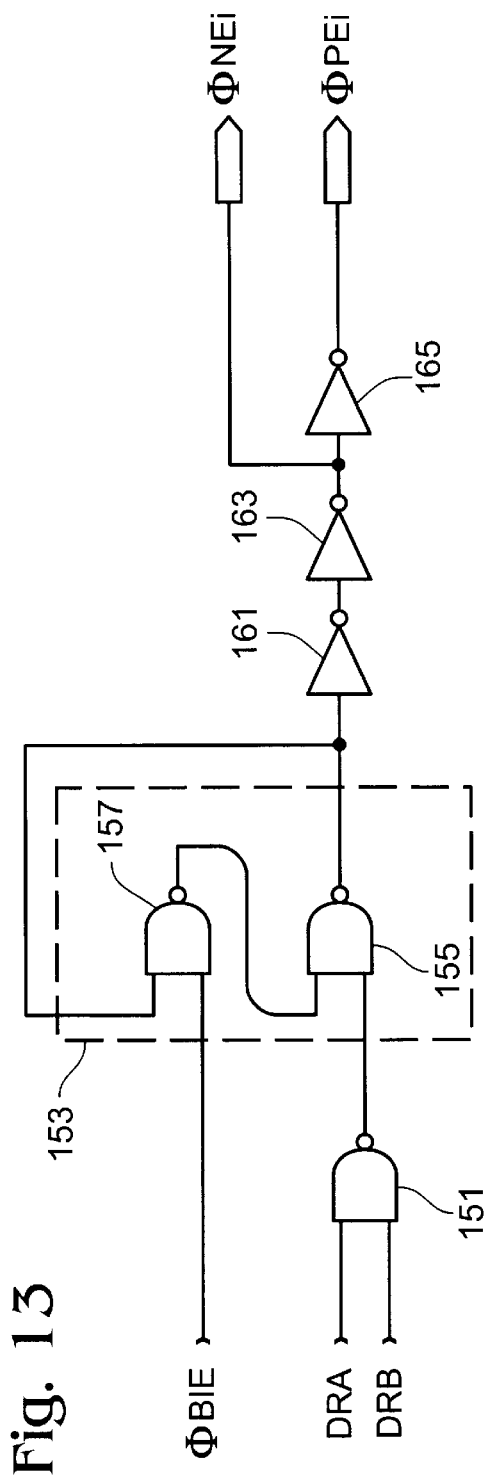
FIG. 13 is a circuit diagram of a bitline activating signal generator according to a first embodiment of the present invention.

FIG. 13 is a circuit diagram of a bitline activating signal generator (26 in FIG. 2) according to a first embodiment of the present invention. This circuit includes NAND gate 151 having DRA and DRB which are row address decoding signals as its inputs, a fourth latching circuit 153 having the output of NAND gate 151 and ΦBIE as its inputs, and inverters 161, 163 and 165 whose input ports are serially connected to the output port of the fourth latching circuit 153 as illustrated. Also, ΦNEi is connected to the output port of inverter 163, and ΦPEi is connected to the output port of inverter 165. The fourth latching circuit 153 includes NAND gate 155 for receiving the output of NAND gate 151 as its input, and NAND gate 157 for receiving the output of NAND gate 155 and the burn-in enable signal ΦBIE as its inputs and applying its output to NAND gate 155.

The operation of the circuit shown in FIG. 13 will now be described. Initially, DRA, DRB and ΦBIE are logic "low". Thus, the outputs of NAND gates 151 and 157 are logic "high", and the output of NAND gate 155 is logic "low", so that ΦNEi goes "low" and ΦPEi goes "high". When the burn-in mode is enabled, ΦBIE, DRA and DRB become logic "high". Then, the output of NAND gate 151 goes "low", and the output of NAND gate 155 goes "high", so that ΦNEi is switched to a logic "high" and ΦPEi is switched to a logic "low". At this time, the output of NAND gate 155 is fed back to NAND gate 157. Then, the output of NAND gate 157 goes "low". From this time, the fourth latching circuit 153 is kept "high", irrespective of DRA and DRB changing states.

In order to reset ΦNEi, the input signals ΦBIE, DRA and DRB must be changed from a logic "high" to a logic "low". Then, the outputs of both the NAND gates 151 and 157 go "high", and the output of NAND gate 155 goes "low". Therefore, ΦNEi falls to a logic low so the bitline activation signal is reset.

Figure 14:
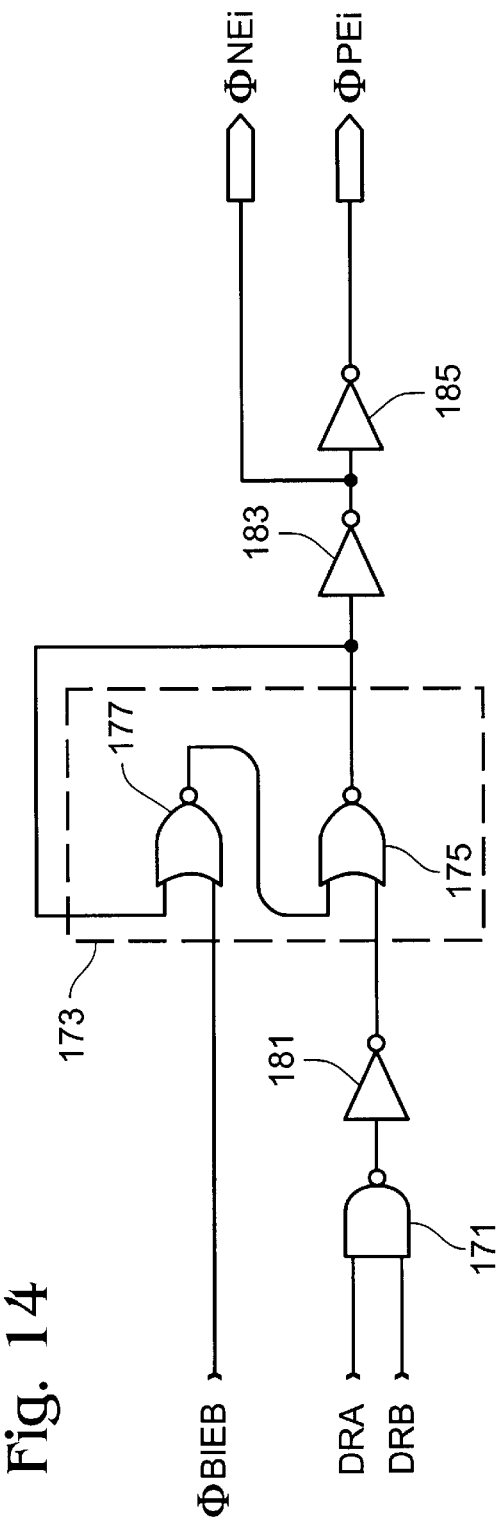
FIG. 14 is a circuit diagram of a bitline activating signal generator according to a second embodiment of the present invention.

FIG. 14 is a circuit diagram of a bitline activating signal generator according to a second embodiment of the present invention. This circuit includes a NAND gate 171 having DRA and DRB which again are row address decoding signals as its inputs, an inverter 181 having its input port connected to the output port of NAND gate 171, a fifth latching circuit 173 having ΦBIEB and the output of inverter 181 as its inputs, an inverter 183 having its input port connected to the output port of latching circuit 173, and another inverter 185 having its input port connected to the output port of inverter 183. The bitline activating signal ΦNEi is output from the output port of inverter 183, and ΦPEi is output from inverter 185.

The fifth latching circuit 173 includes a NOR gate 175 for receiving the output of inverter 181 as its input, and a NOR gate 177 for receiving the output of NOR gate 175 and ΦBIEB as its inputs and applying its output to NOR gate 175.

The operation of the circuit shown in FIG. 14 will now be described. Initially, DRA and DRB are logic "low" and ΦBIEB is logic "high". Thus, the output of NAND gates 171 is logic "high", and the output of NOR gate 175 is logic "low", so that the output of NOR gate 175 goes "high". Therefore, ΦNEi is output by inverter 183 as a logic "low", since the output of NOR gate 175 is logic "high". Also, ΦPEi goes "high" as ΦNEi is inverted. In such a state, as the burn-in mode is enabled, DRA and DRB go "high" and ΦBIEB goes "low". Thus, the output of NAND gate 171 goes "low", and the output of NOR gate 175 goes "low", so that ΦNEi is switched to a logic "high". At the same time, the output of NOR gate 175 is fed back to NOR gate 177. Since the inputs of the NOR gate 177 are now both logic "low", the output of NOR gate 177 goes "high". From this time, the output of the fifth latching circuit 173 is kept "low", irrespective of DRA and DRB, and ΦNEi is held "high".

In order to reset ΦNEi, DRA and DRB must go "low" and ΦBEIB must go "high". Then, the output of NAND gate 171 goes "high", to make the output of NOR gate 175 go "high". Therefore, ΦNEi goes "low" and thus is reset.

Figure 15:
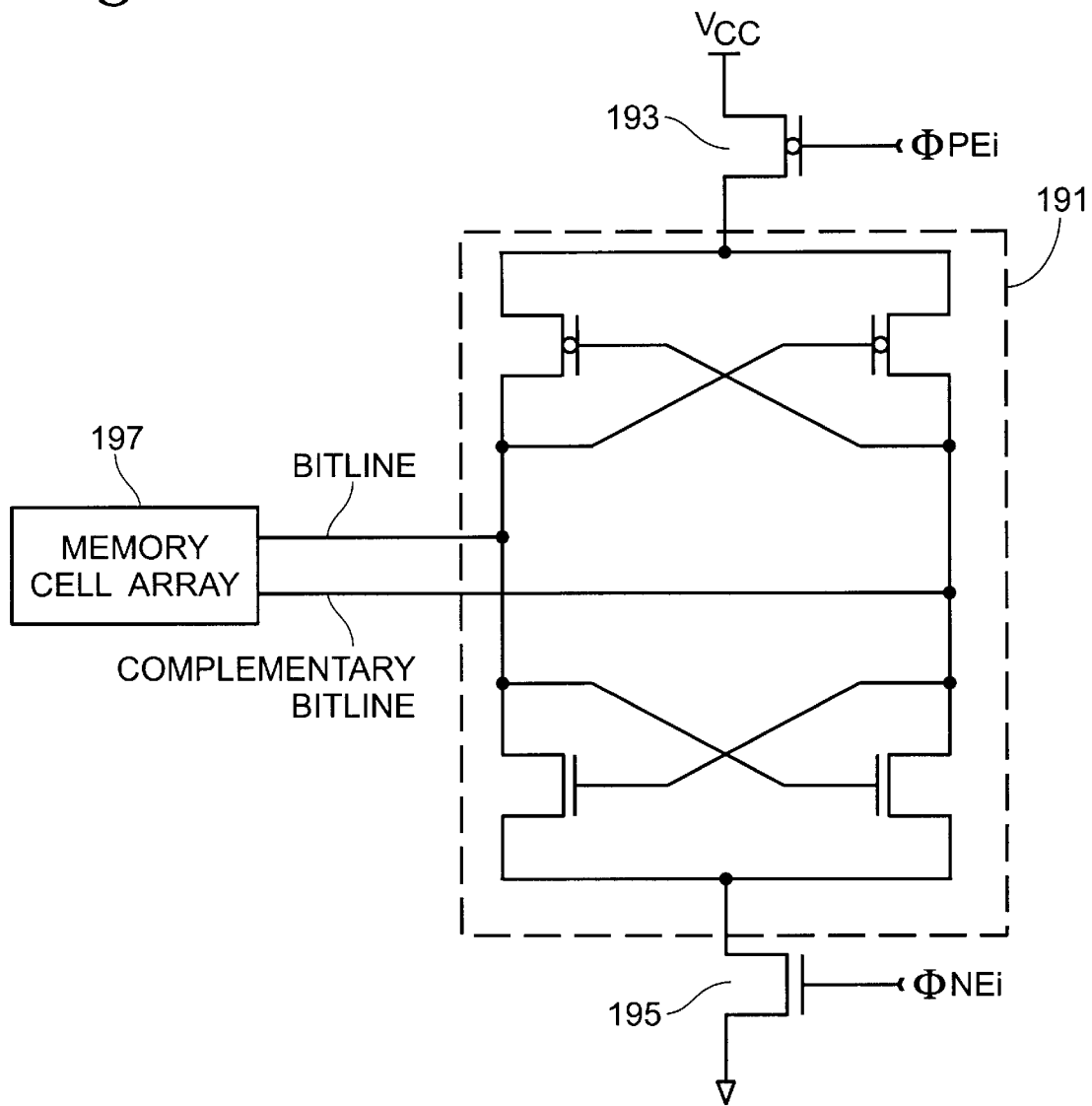
FIG. 15 is a circuit diagram of a bitline detector (sense amp) according to a preferred embodiment of the present invention.

FIG. 15 is a circuit diagram of a bitline sensor according to a preferred embodiment of the present invention. This circuit, often called a sense amp, includes: a differential amplifier 191; a PMOS transistor 193 connecting the differential amplifier 191 to a power supply source Vcc; and an NMOS transistor 195 connecting the differential amplifier 191 to ground. The differential amplifier 191 is connected to a memory cell array 197 via a bitline and a complementary bitline.

The operation of the circuit shown in FIG. 15 is described next. When the burn-in mode is enabled, ΦNEi goes "high" and ΦPEi goes "low". Thus, both the PMOS transistor 193 and NMOS transistor 195 are activated, which in turn activates the differential amplifier. The differential amplifier 191 reads data out of the memory cell array 197 via the activated bitline. Therefore, during the burn-in mode, all bitlines can always be read by the differential amplifier 191.

In the burn-in stress circuit for a semiconductor memory device according to the present invention, burn-in stress is applied to access transistors each connected to respective wordlines while all wordlines are activated, so that the burn-in time is reduced. Also, the burn-in time is not increased even though memory capacity of the semiconductor memory device increases.

The present invention is not limited to the above embodiment, and it is apparent that various modifications may be effected by those skilled in the art within the technical spirit of the present invention.

We claim:

1. A burn-in stress circuit for a semiconductor memory device comprising:

a burn-in enable signal generator for generating a burn-in enable signal in response to first control signals;

a wordline predecoder for generating a wordline driving voltage for driving a wordline in response to the burn-in enable signal and second control signals;

a wordline decoder for applying the wordline driving voltage to a selected wordline in response to the burn-in enable signal and third control signals; and a first latch for maintaining the burn-in enable signal in an active state during selection of additional wordlines, so as to provide for simultaneous stress testing of multiple wordlines in the device;

a bitline activating signal generator for generating a bitline activating signal in response to the burn-in enable signal and another plurality of control signals; and a bitline detector for operating in response to the bitline activating signal.

2. The burn-in stress circuit of claim 1, wherein the first latch includes a cross-coupled pair of logic gates.

3. The burn-in stress circuit of claim 1, wherein the first latching circuit includes first and second NAND logic gates arranged in a feedback configuration.

4. The burn-in stress circuit of claim 1, wherein the burn-in enable signal generator includes a NAND gate for receiving the plurality of control signals as its inputs, and an inverter for receiving the output of the NAND gate as its input and producing the burn-in enable signal.

5. The burn-in stress circuit of claim 1, wherein the burn-in enable signal generator includes an NMOS transistor whose first electrode is connected to one of the first control signals, whose gate is connected to a power supply voltage and whose second electrode is grounded, a first inverter whose input port is connected to the first electrode of the NMOS transistor, and a second inverter for receiving the output of the first inverter and producing the burn-in enable signal.

6. The burn-in stress circuit of claim 1, wherein the wordline predecoder includes a first NOR gate for receiving another plurality of control signals as its inputs, a second latching circuit for receiving the burn-in enable signal and the output of the first NOR gate as its inputs, an inverter for receiving the output of the second latching circuit, a first NMOS transistor whose first electrode is connected to an output port of the inverter and whose gate is connected to a power supply voltage, a second NMOS transistor whose gate is connected to the second electrode of the first NMOS transistor and whose first electrode is connected to one of another plurality of signals, and a third NMOS transistor whose gate is connected to an output port of the second latching circuit, whose first electrode is connected to the second electrode of the second NMOS transistor and whose second electrode is grounded, wherein the wordline driving voltage is output from the first electrode of the third NMOS transistor.

7. The burn-in stress circuit of claim 6, wherein the second latching circuit includes a second NOR gate for receiving the output of the first NOR gate as its input, and a third NOR gate for receiving the output of the second NOR gate and the burn-in enable signal as its inputs and applying its output to the gate of the second NOR gate.

8. The burn-in stress circuit of claim 1, wherein the wordline decoder includes a first NAND gate for receiving another plurality of control signals as its inputs, a third latching circuit for receiving the output of the first NAND gate and the burn-in enable signal as its inputs, an inverter for receiving the output of the third latching circuit as its input, a first NMOS transistor whose first electrode is connected to an output port of the third latching circuit and whose gate is connected to a power supply voltage, a second NMOS transistor whose gate is connected to the second electrode of the first NMOS transistor and whose first electrode is connected to the wordline driving voltage, and a third NMOS transistor whose first electrode is connected to the second electrode of the second NMOS transistor, whose gate is connected to the output port of the inverter and whose second electrode is grounded, wherein the first electrode of the third NMOS transistor is connected to the wordline.

9. The burn-in stress circuit of claim 8, wherein the third latching circuit includes a second NAND gate for receiving the output of the first NAND gate as its input, and a third NAND gate for receiving the output of the second NAND gate and the burn-in enable signal and applying its output to the second NAND gate.

10. The burn-in stress circuit of claim 1, wherein the bitline activating signal generator includes a first NAND gate for receiving another plurality of control signals as its inputs, a fourth latching circuit for receiving the output of the first NAND gate and the burn-in enable signal as its inputs, a first inverter for receiving the output of the fourth latching circuit as its input, a second inverter for receiving the output of the first inverter as its input and producing the bitline activating signal, and a third inverter for receiving the output of the second inverter and producing an inverted signal of the bitline activating signal.

11. The burn-in stress circuit of claim 10, wherein the fourth latching circuit includes a second NAND gate for receiving the output of the first NAND gate as its input, and a third NAND gate for receiving the output of the second NAND gate and the burn-in enable signal and applying its output to the second NAND gate.

12. The burn-in stress circuit of claim 1, wherein the bitline activating signal generator includes an NAND gate for receiving another plurality of control signals as its inputs, a first inverter for receiving the output of the NAND gate as its input, a fourth latching circuit for receiving the output of the first inverter and the inverted signal of the burn-in enable signal as its inputs, a second inverter for receiving the output of the fourth latching circuit as its input and producing the bitline activating signal, and a third inverter for receiving the output of the second inverter and producing an inverted signal of the bitline activating signal.

13. The burn-in stress circuit of claim 12, wherein the fourth latching circuit includes a first NOR gate for receiving the output of the first inverter as its input, and a second NOR gate for receiving the output of the first NOR gate and the inverted signal of the burn-in enable signal and applying its output to the first NOR gate.

14. The burn-in stress circuit of claim 1, wherein the bitline detector includes an NMOS transistor whose gate is connected to the bitline activating signal and whose second electrode is connected to a ground voltage, a PMOS transistor whose gate is connected to the inverted signal of the bitline activating signal and whose first electrode is connected to a power supply voltage, and a differential amplifier connected to the second electrode of the PMOS transistor and to the second electrode of the NMOS transistor and being activated when the bitline activating signal and the inverted signal thereof are both enabled.

* * * * *